US009733273B2

(12) United States Patent
Nakajima

(10) Patent No.: US 9,733,273 B2
(45) Date of Patent: Aug. 15, 2017

(54) TESTING METHOD FOR SEMICONDUCTOR MANUFACTURING EQUIPMENT

(71) Applicant: RENESAS ELECTRONICS CORPORATION, Tokyo (JP)

(72) Inventor: Yusuke Nakajima, Takasaki (JP)

(73) Assignee: RENESAS SEMICONDUCTOR PACKAGE & TEST SOLUTIONS CO., LTD., Gunma (JP)

( * ) Notice: Subject to any disclaimer, the term of this patent is extended or adjusted under 35 U.S.C. 154(b) by 0 days.

(21) Appl. No.: 14/979,366

(22) Filed: Dec. 22, 2015

(65) Prior Publication Data

US 2016/0202293 A1    Jul. 14, 2016

(30) Foreign Application Priority Data

Jan. 9, 2015  (JP) ................................ 2015-003527

(51) Int. Cl.
*G01R 31/00* (2006.01)
*G01R 1/073* (2006.01)
*G01R 31/02* (2006.01)
*G01R 31/28* (2006.01)

(52) U.S. Cl.
CPC ......... *G01R 1/07314* (2013.01); *G01R 31/02* (2013.01); *G01R 31/2808* (2013.01)

(58) Field of Classification Search
CPC ............................ G01R 1/07314; G01R 31/02
USPC ....................... 324/756.03, 500, 537, 756.01
See application file for complete search history.

(56) References Cited

U.S. PATENT DOCUMENTS

| 6,763,157 B1* | 7/2004 | Williams | G02B 6/43 385/15 |
| 6,843,658 B2 | 1/2005 | Kuwabara et al. | |
| 6,941,034 B2* | 9/2005 | Kuboi | G02B 6/359 385/17 |
| 7,379,641 B1* | 5/2008 | Johnson | G02B 6/4222 385/115 |
| 7,637,789 B2* | 12/2009 | Nakatani | H01R 4/023 439/76.2 |

(Continued)

FOREIGN PATENT DOCUMENTS

| JP | H06-75008 A | 3/1994 |
| JP | 2003-037379 A | 2/2003 |

(Continued)

*Primary Examiner* — Giovanni Astacio-Oquendo
(74) *Attorney, Agent, or Firm* — McDermott Will & Emery LLP

(57) ABSTRACT

The time required to test an electronic device mounted in semiconductor manufacturing equipment can be reduced. A first test panel mounted, on a first connector surface thereof, with plural first test-object connectors respectively including plural first terminals electrically coupled to an electronic device and a second test panel mounted, on a second connector surface thereof, with plural second test-object connectors respectively including plural spring probes are provided. The first connector surface of the first test panel and the second connector surface of the second test panel are positioned to face each other, the spring probes included in the second test-object connectors are electrically coupled to the first terminals included in the first test-object connectors, and a functional test concerning an electrical characteristic of the electronic device is performed.

8 Claims, 12 Drawing Sheets

(56) References Cited

U.S. PATENT DOCUMENTS 7,790,987 B2 * 9/2010 Kasahara ................ H01L 24/16
174/260
8,872,533 B2 * 10/2014 Durbin ............... G01R 1/07378
324/754.03

FOREIGN PATENT DOCUMENTS

JP          2003-346963 A     12/2003
JP          2007-315937 A     12/2007

* cited by examiner

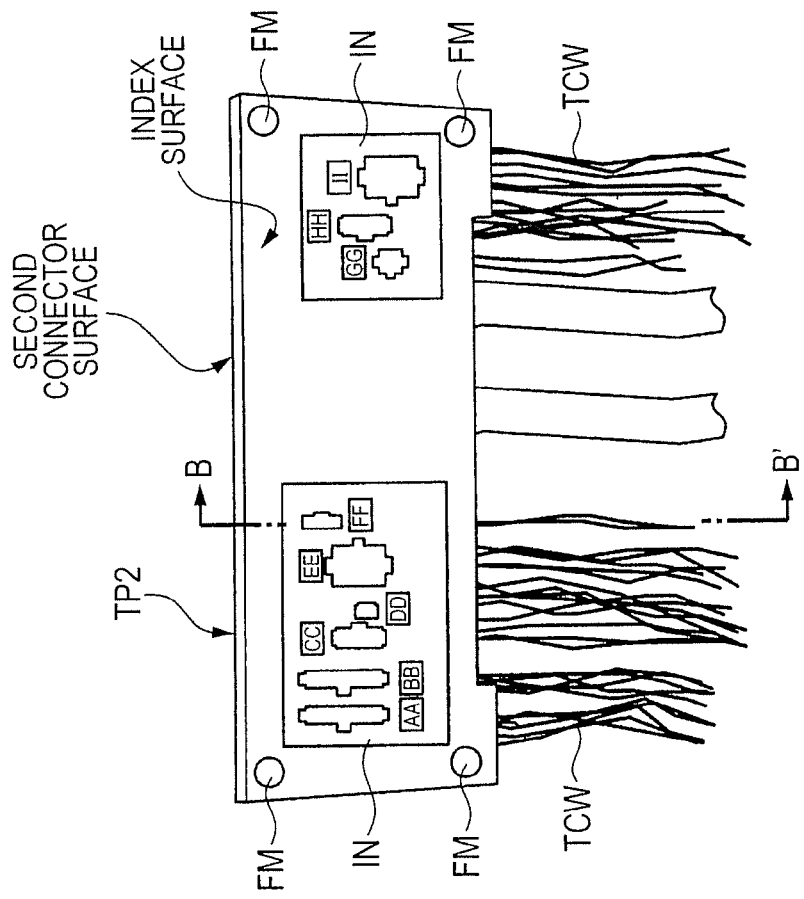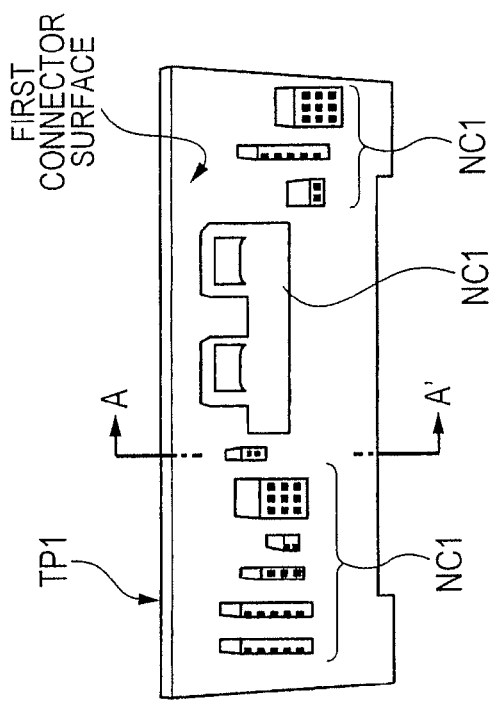

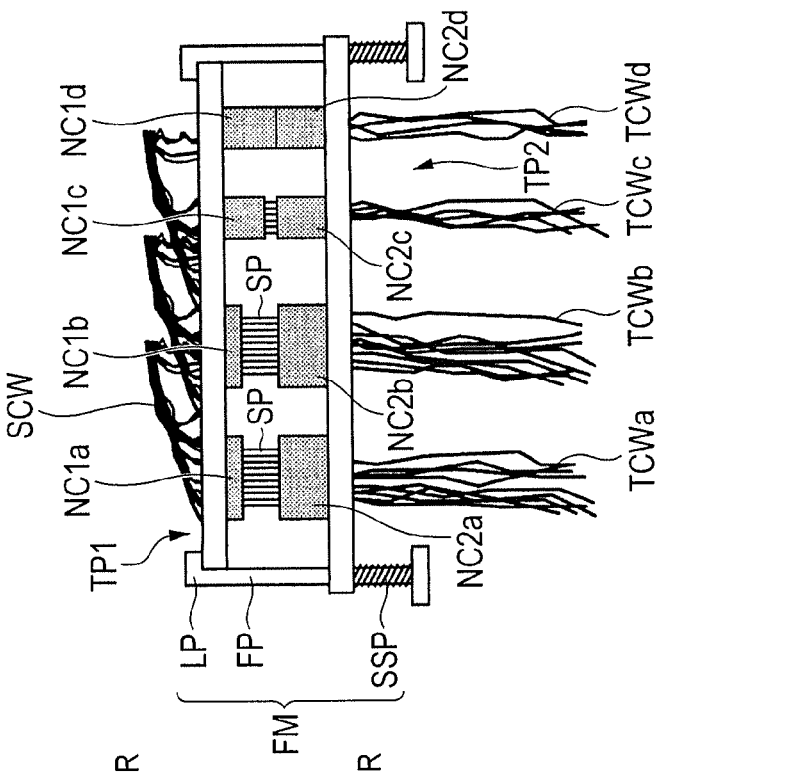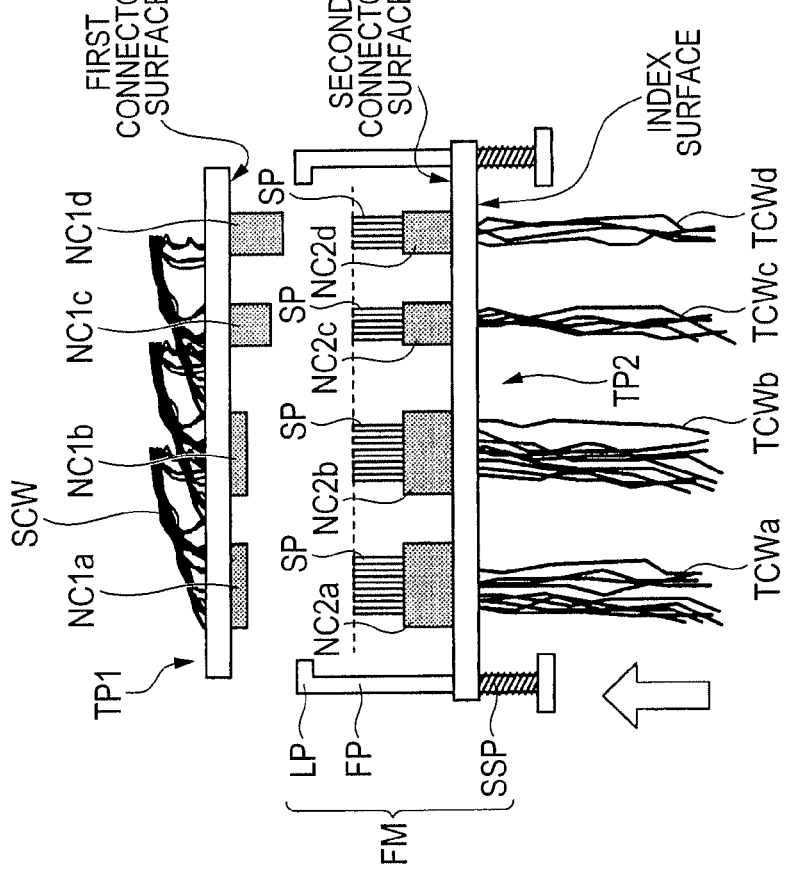

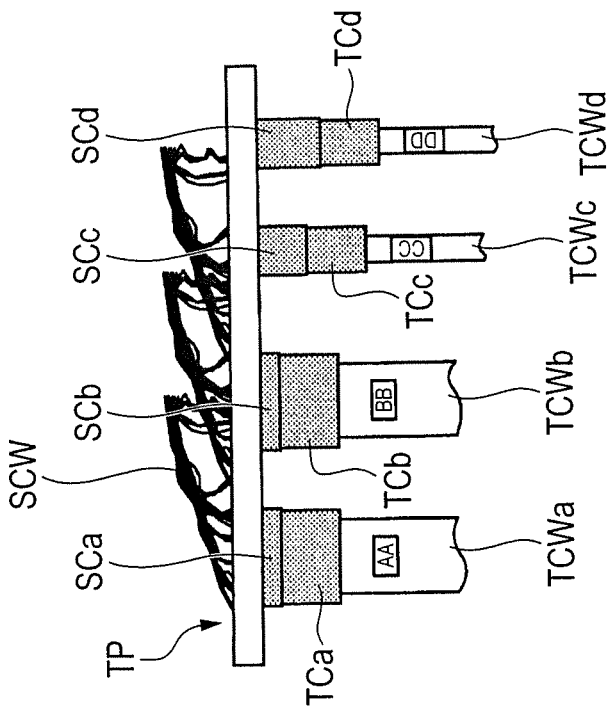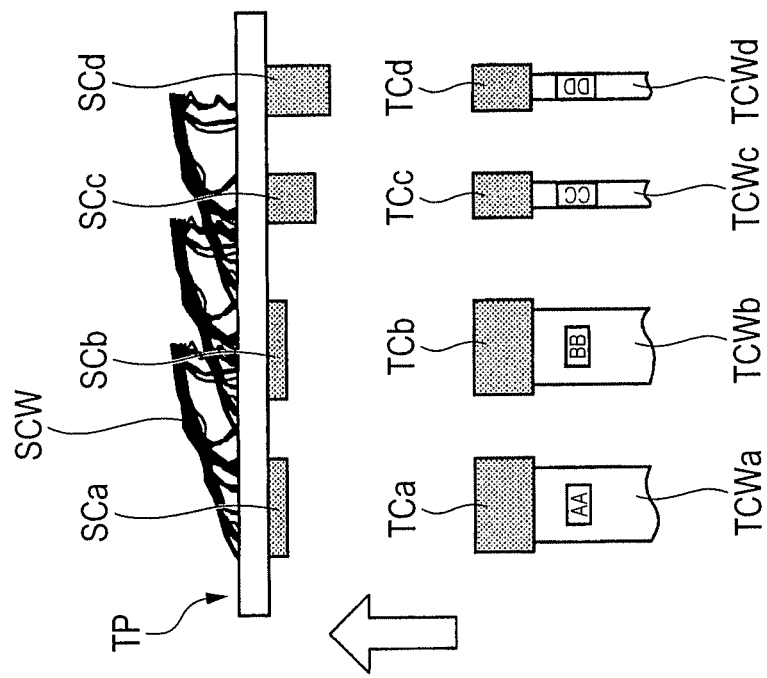

TESTING METHOD FOR SEMICONDUCTOR MANUFACTURING EQUIPMENT

CROSS-REFERENCE TO RELATED APPLICATIONS

The disclosure of Japanese Patent Application No. 2015-003527 filed on Jan. 9, 2015 including the specification, drawings and abstract is incorporated herein by reference in its entirety.

BACKGROUND

The present invention relates to a testing method for semiconductor manufacturing equipment which can be suitably applied to a functional test concerning an electrical characteristic of an electronic device mounted in, for example, semiconductor manufacturing equipment.

In Japanese Unexamined Patent Application Publication No. 2007-315937, a semiconductor testing system is disclosed which uses a burn-in board including a socket board, a Pogo pin board and a circuit forming board, allowing the socket board and the Pogo pin board to be commonly used for different types of semiconductor devices housed in a same type of packages.

In Japanese Unexamined Patent Application Publication No. Hei 06(1994)-075008, a technique is disclosed in which Pogo pins mounted on a first substrate and a Pogo-pin contact pattern mounted on a second substrate are easily decouplably coupled.

In Japanese Unexamined Patent Application Publication No. 2003-037379, a printed circuit board coupling structure is disclosed which includes a push switch mounted on a printed circuit board and an actuating member mounted on a backboard. The push switch is for turning on/off the connection between a power terminal and a power line included in each connector mounted on the printed circuit board. The actuating member is for completely turning on the push switch when the connectors on the printed circuit board are coupled to backboard connectors.

In Japanese Unexamined Patent Application Publication No. 2003-346963, an electrical connector is disclosed which includes an insulated substrate having a volute spring inserted therethrough.

SUMMARY

In testing an electronic device (a test object) mounted in semiconductor manufacturing equipment, plural testing-device connectors coupled to a testing device via cables for a testing device are coupled to plural test-object connectors coupled to an electronic device via cables for a test object. Coupling plural testing-device connectors and plural test-object connectors were performed by attaching an index to each cable for a testing device provided for each testing-device connector and manually checking the correspondences between the testing-device connectors and the test-object connectors one by one. In a testing process performed in this way, much more time used to be spent in coupling test-object connectors and testing-device connectors than in performing a functional test concerning an electrical characteristic of an electronic device.

Other problems and novel features of the present invention will become apparent from the description of this specification and attached drawings.

In a testing method for semiconductor manufacturing equipment according to an embodiment of the present invention, a first test panel mounted, on a first connector surface thereof, with plural first test-object connectors respectively including plural terminals electrically coupled to an electronic device and a second test panel mounted, on a second connector surface thereof, with plural second test-object connectors respectively including plural extensible and retractable probes are provided. Then, the first connector surface of the first test panel and the second connector surface of the second test panel are positioned to face each other, the spring probes included in the second test-object connectors are electrically coupled to the first terminals included in the first test-object connectors, and a functional test concerning an electrical characteristic of the electronic device is performed.

According to an embodiment of the present invention, the time required to test an electronic device mounted in semiconductor manufacturing equipment can be reduced.

BRIEF DESCRIPTION OF THE DRAWINGS

FIG. 3A is a schematic view of a first connector surface of the first test panel on the electronic device side according to an embodiment, and FIG. 3B is a schematic view of an index surface of the second test panel on the testing device side according to an embodiment.

FIG. 5A is a schematic diagram showing first test-object connectors mounted on the first connector surface of the first test panel on the electronic device side and second test-object connectors mounted on the second connector surface of the second test panel on the testing device side in a state of facing each other according to an embodiment, and FIG. 5B is a schematic diagram showing the first and second test-object connectors shown in FIG. 5A in a state of being coupled to each other according to an embodiment.

FIG. 12A is a schematic diagram showing a test panel studied by the present inventors and four testing-device connectors, in which the test panel is shown mounted with four test-object connectors, and the four testing-device connectors are shown facing the four test-object connectors, and FIG. 12B is a schematic diagram showing the test panel and the four testing-device connectors shown in FIG. 12A in a state in which the four test-object connectors are coupled with the four testing-device connectors, respectively.

DETAILED DESCRIPTION

Figure 1:
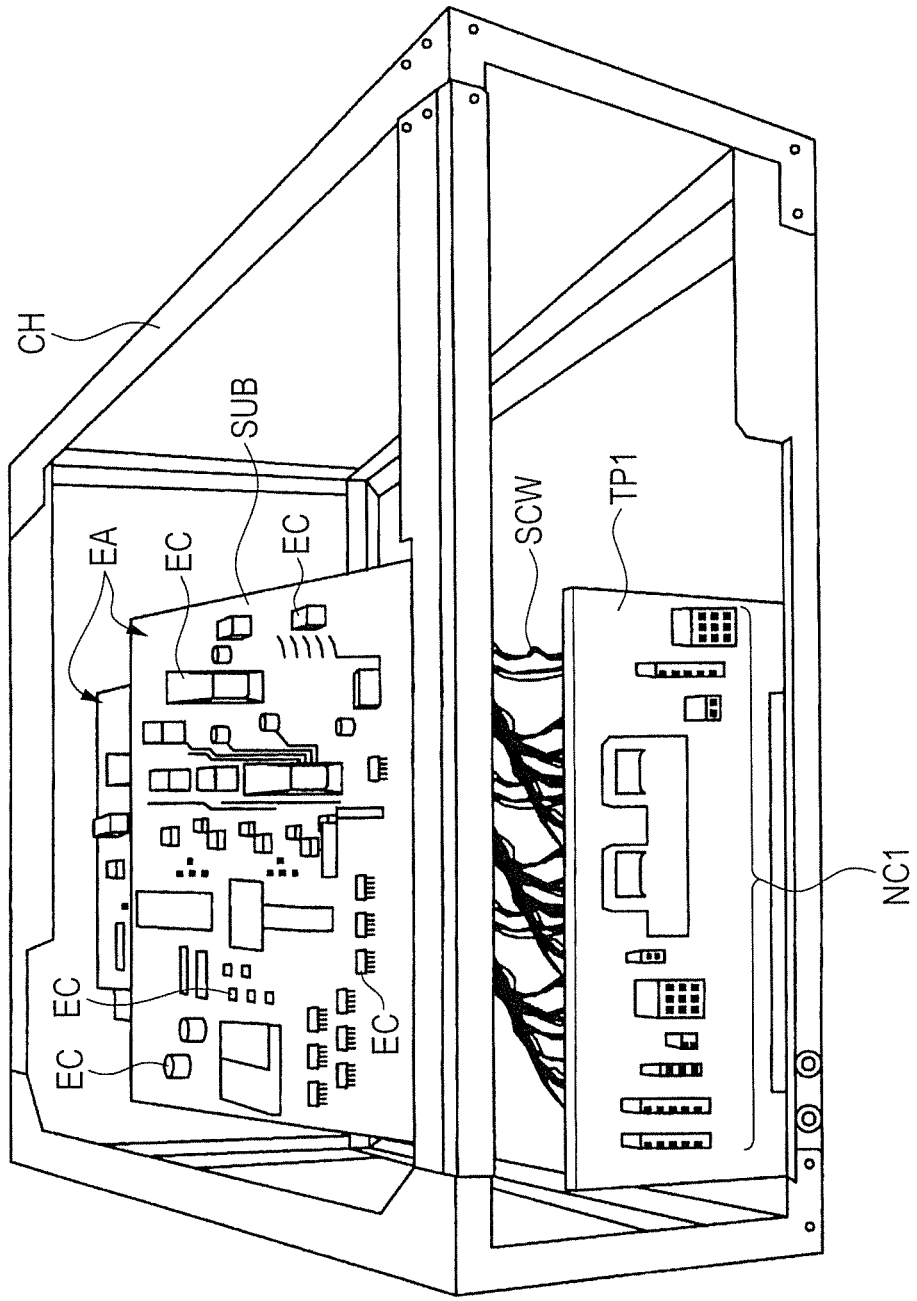
FIG. 1 is an external view illustrating a first test panel on the electronic device side attached to a chassis according to an embodiment.

In the following, the description will be divided into two or more sections or will range over two or more embodiments as required for the sake of convenience. Unless otherwise expressed, such sections and embodiments are not mutually irrelevant. For example, among such sections and embodiments, one is a partial or total modification of another, or one elaborates or supplements another.

Also, numbers referred to in the following description of embodiments (for example, numbers representing counts, amounts, ranges, or other numeric values) do not represent defined values, that is, they may be smaller or larger unless otherwise expressed or except when they are apparently defined in principle.

Furthermore, the constituent elements (including element steps) of the following embodiment are not necessarily indispensable unless otherwise expressed or except when they are considered apparently indispensable in principle.

Also, in the following description, when something is described as "comprising A," "including A," "having A," or "containing A," it may also include elements other than A unless otherwise expressed. Similarly, the shapes of and positional relationships between constituent elements referred to in the following description are inclusive of those substantially close to or similar to them unless otherwise expressed or except when such shapes and positional relationships are apparently considered defined in principle. This also applies to the numeric values and ranges.

Note that the drawings referred to in describing the following embodiment may include plan views hatched for the sake of clarity. Also, in all drawings referred to in describing the following embodiment, parts and members having identical functions are denoted by identical reference numerals and symbols and that, as a rule, descriptions of such identical or similar parts and members are not repeated. The present embodiment will be described in detail below with reference to drawings.

(Detailed Description of Problems in Electronic Device Testing)

Problems related with the electronic device testing method devised by the present inventors will be described in detail so as to facilitate understanding of the testing method for an electronic device installed in semiconductor manufacturing equipment.

Figure 11:
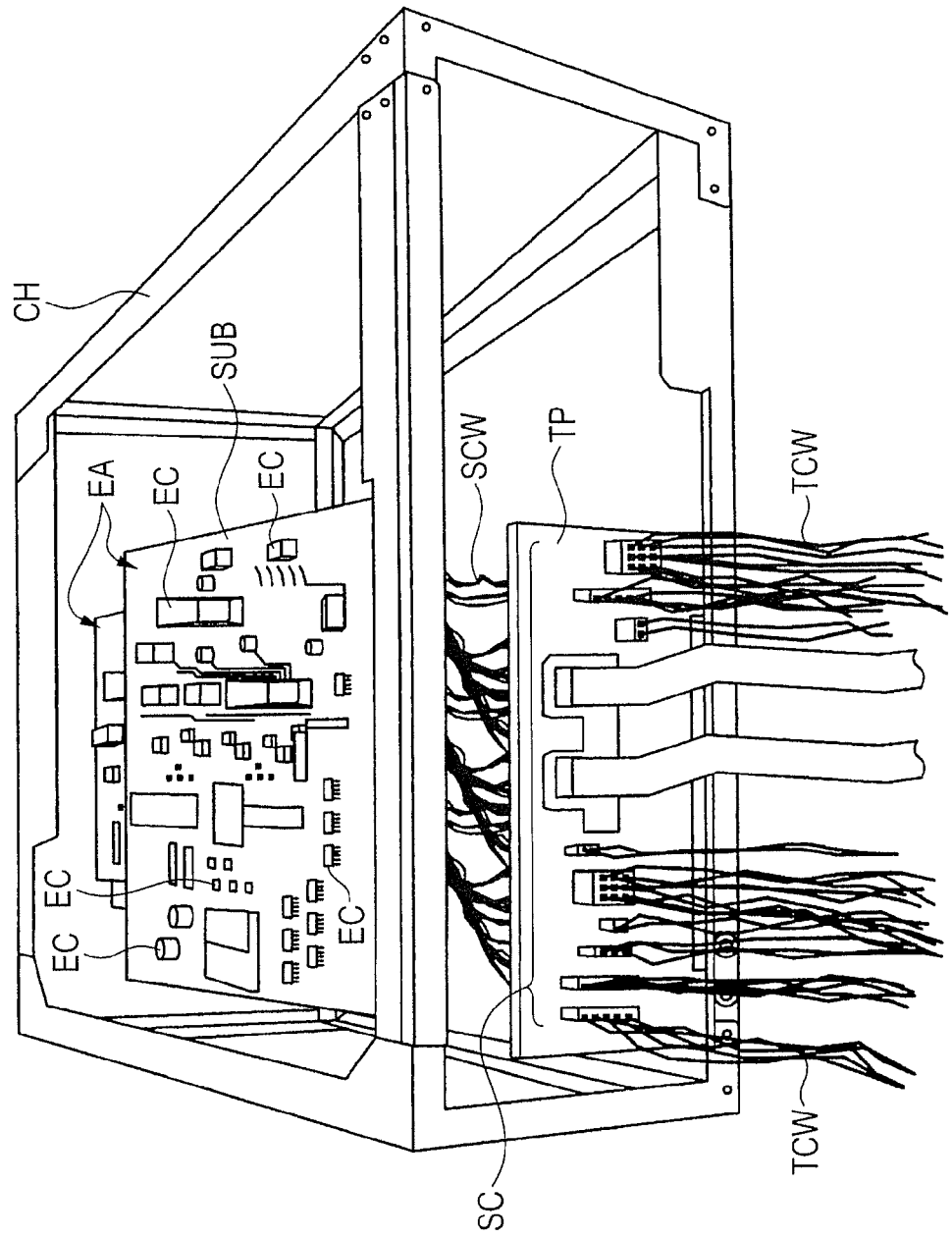
FIG. 11 is an external view illustrating a test panel installed in a chassis studied by the present inventors.

FIG. 11 is an external view illustrating a test panel installed in a chassis studied by the present inventors.

As shown in FIG. 11, electronic devices EA which are objects to be tested are installed in a chassis CH built into semiconductor manufacturing equipment, for example, dicing equipment. A test panel TP is provided on an optional outer surface of the chassis CH. The surface facing outward from the chassis CH of the test panel TP (hereinafter referred to as the "connector surface") is mounted with plural test-object connectors SC. On the surface facing the interior of the chassis CH of the test panel TP (hereinafter referred to as the "surface opposite to the connector surface"), the external terminals (not shown) of the test-object connectors SC are exposed.

An electronic device EA includes a substrate SUB and plural electronic components EC mounted on the main surface of the substrate SUB. On the reverse side of the main surface, external terminals (not shown) of the electronic components EC are exposed. The external terminals exposed on the reverse side of the substrate SUB and the external terminals exposed on the surface opposite to the connector surface of the test panel TP are electrically coupled via plural cables SCW for an object to be tested.

The test-object connectors SC mounted on the connector surface of the test panel TP are coupled with testing-device connectors (not shown), respectively. The testing-device connectors are electrically coupled with a testing device (not shown) via cables TCW for a testing device.

FIG. 12A is a schematic diagram showing a test panel studied by the present inventors and four testing-device connectors, in which the test panel is shown mounted with four test-object connectors, and the four testing-device connectors are shown facing the four test-object connectors. FIG. 12B is a schematic diagram showing the test panel and the four testing-device connectors shown in FIG. 12A in a state in which the four test-object connectors are coupled with the four testing-device connectors, respectively. The four test-object connectors and the four testing-device connectors shown in FIGS. 12A and 12B represent four examples out of all test-object connectors and four examples out of all testing-device connectors, respectively.

As shown in FIG. 12A, four testing-device connectors TCa, TCb, TCc and TCd corresponding to four test-object connectors SCa, SCb, SCc and SCd are provided. The testing-device connectors TCa, TCb, TCc and TCd are coupled with cables for a testing device TCWa, TCWb, TCWc and TCWd, respectively. For easy visual identification of the testing-device connectors TCa, TCb, TCc and TCd corresponding to the test-object connectors SCa, SCb, SCc and SCd, either the testing-device connectors TCa, TCb, TCc and TCd or the cables for a testing device TCWa, TCWb, TCWc and TCWd are each marked with an ID code.

According to the electronic device testing method studied by the present inventors, the cables for a testing device TCWa, TCWb, TCWc and TCWd are attached with identification seals marked, for example, "AA," "BB," "CC," and "DD," respectively.

Referring to FIG. 12B, the testing-device connectors TCa, TCb, TCc and TCd are coupled to the test-object connectors SCa, SCb, SCc and SCd. This is done while manually checking the correspondences between them one by one referring to the identification seals attached to the cables for a testing device TCWa, TCWb, TCWc and TCWd. After the testing-device connectors TCa, TCb, TCc and TCd are coupled to the test-object connectors SCa, SCb, SCc and SCd, function tests are performed at the testing device concerning an electrical characteristic of the electronic device.

In the above manner in which the testing-device connectors TCa, TCb, TCc and TCd are manually coupled to the test-object connectors SCa, SCb, SCc and SCd, however, much more time used to be spent in coupling the connectors TCa, TCb, TCc and TCd than in performing a functional test concerning an electrical characteristic of the electronic device.

Furthermore, when similarly shaped test-object connectors SCa, SCb, SCc and SCd to be used for different tests and similarly shaped testing-device connectors TCa, TCb, TCc and TCd to be used for different tests are involved, the occurrence of couplings between wrong connectors is feared.

EMBODIMENT

<Semiconductor Manufacturing Equipment>

Semiconductor manufacturing equipment according to the present embodiment will be described below. In the present embodiment, dicing equipment is used as semiconductor manufacturing equipment on which electronic devices are mounted as objects to be tested, but the semiconductor manufacturing equipment is not limited to dicing equipment.

Normally, after a large number of semiconductor elements are formed over the main surface of a semiconductor wafer of silicon (Si) or gallium arsenide (GaAs), the semiconductor wafer is separated into individual semiconductor chips in a process such as dicing or scribing. Subsequently, finished semiconductor products are obtained via an assembly process and a mounting process.

In the dicing process, the reverse side (the surface opposite to the main surface) of the semiconductor wafer is polished or etched until the semiconductor wafer is as thin as desired for easy chip processing. This can be done, for example, by bonding the main surface of the semiconductor wafer over which semiconductor elements are formed to a polishing jig using an electron wax, then polishing or etching the reverse side of the semiconductor wafer. Subsequently, the electron wax is removed using a solvent, and the thinned semiconductor wafer is removed from the polishing jig.

Next, a dicing sheet is applied to the reverse side of the semiconductor wafer, then the semiconductor wafer is placed on a dicing table such that the reverse side of the semiconductor wafer opposes the dicing table. Subsequently, the semiconductor wafer is cut along scribe lines formed on the main surface of the semiconductor wafer using a dicing blade which is an ultrathin circular blade with diamond microparticles bonded thereto, thereby generating individual semiconductor chips.

Next, the reverse side of each individual semiconductor chip thus generated is pushed up by a push-up pin rising through the dicing table, thereby separating the semiconductor chip from the dicing table. A collet is positioned upward of the push-up pin to face the push-up pin. The semiconductor chip separated from the dicing table is sucked and held by the collet to be then carried to, for example, a prescribed position over a mounting board.

A main feature of the present embodiment is the testing method used when performing a functional test concerning an electrical characteristic of an electronic device mounted in a chassis built into the dicing equipment. The details and effects of the testing method will be clarified by the following description.

<Electronic Device Testing Method>

The method for testing an electronic device (object to be tested) mounted in a chassis built into semiconductor manufacturing equipment according to the present embodiment will be described in the following with reference to FIGS. 1 to 8.

FIG. 1 is an external view illustrating a first test panel on the electronic device side attached to a chassis according to the present embodiment.

As shown in FIG. 1, electronic devices EA which are objects to be tested are mounted in a chassis CH built into semiconductor manufacturing equipment, for example, dicing equipment. An optional outer side of the chassis CH is attached with a first test panel (a first test substrate) TP1 on the electronic device side. The surface facing outward from the chassis CH of the first test panel TP1 (hereinafter referred to as the "first connector surface") is mounted with plural first test-object connectors NC1. On the surface facing the interior of the chassis CH of the first test panel TP1 (hereinafter referred to as the "surface opposite to the first connector surface"), the external terminals (not shown) of the test-object connectors NC1 are exposed.

An electronic device EA includes a substrate SUB and plural electronic components EC mounted on the main surface of the substrate SUB. The substrate SUB is, for example, a built-up multi-layer printed circuit board including multiple layers of conductor patterns and insulation layers. On the multi-layer printed circuit board serving as a core of the substrate SUB, insulation layers each with a conductor pattern formed thereover are formed, and the conductor patterns each sandwiched between insulation layers are intercoupled by plating through fine holes called via-holes formed through the insulation layers. The external terminals (not shown) of the electronic components EC are coupled to the surface-layer conductor pattern formed over the main surface of the substrate SUB and are electrically continuous to plural connectors (not shown) serving as external terminals of the substrate SUB via via-holes formed through the substrate SUB and inner-layer conductor patterns. The external terminals of the substrate SUB and the external terminals exposed on the surface opposite to the first connector surface of the first test panel TP1 are electrically coupled via plural cables SCW for an object to be tested.

Figure 2:
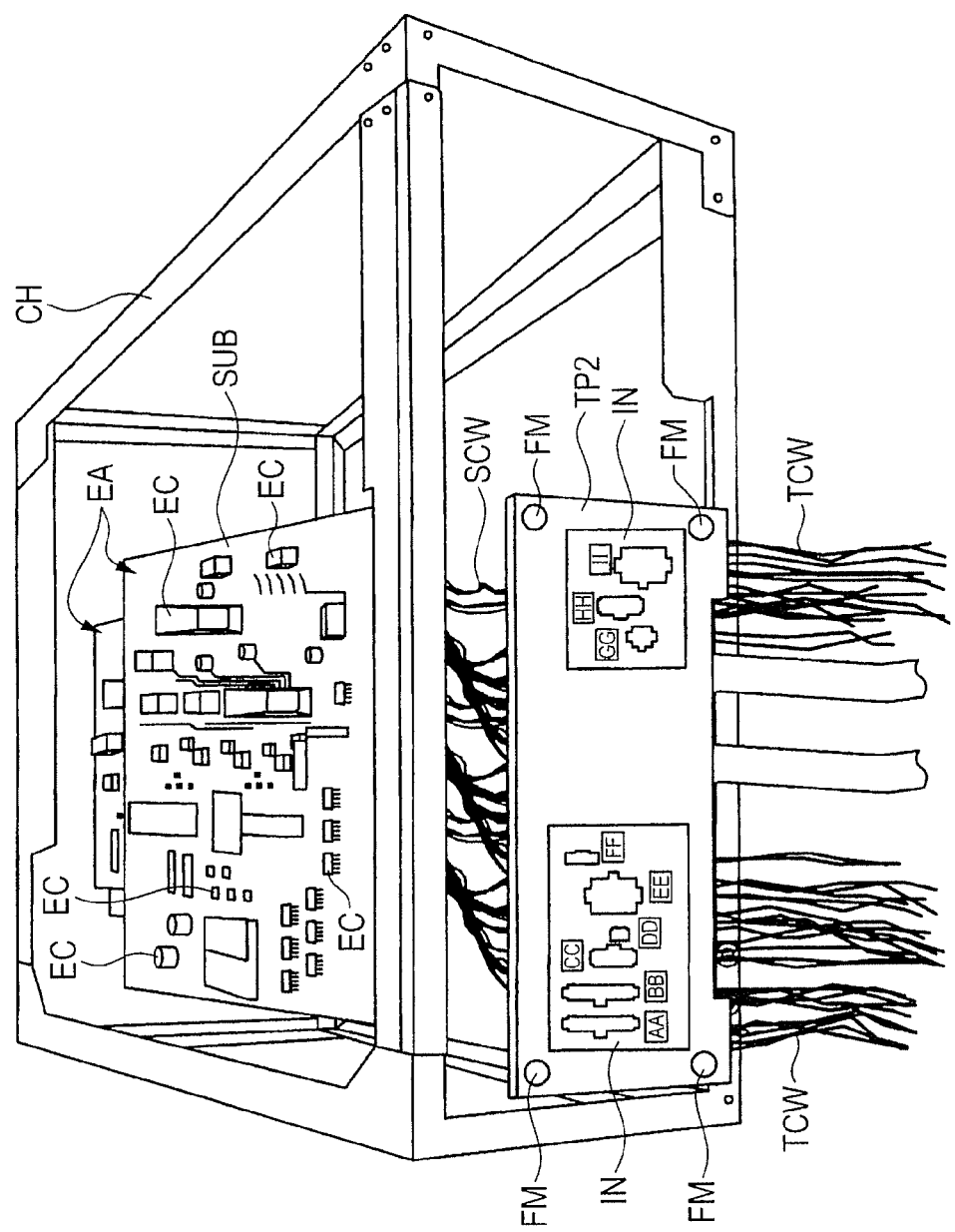
FIG. 2 is an external view illustrating a second test panel on the testing device side in a state of being coupled to the first test panel on the electronic device side attached to the chassis according to an embodiment.
Figure 4:
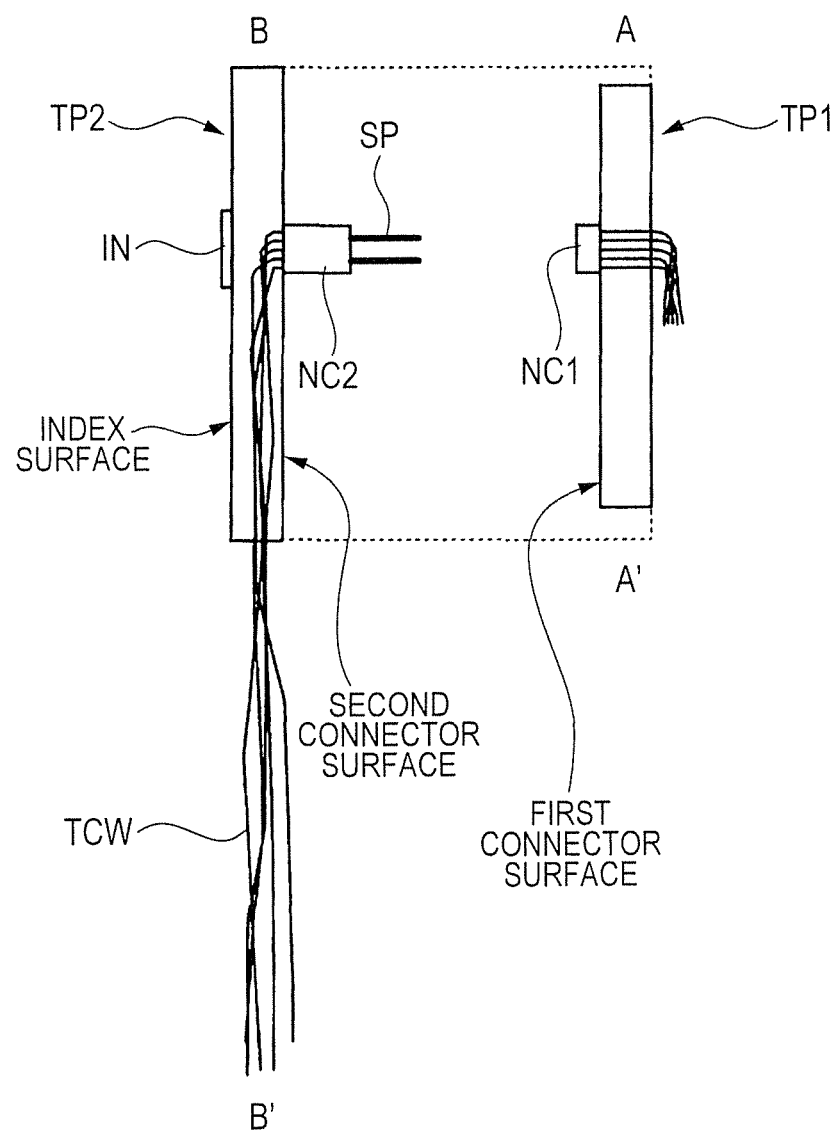
FIG. 4 shows sectional views of main parts of the first test panel on the electronic device side and the second test panel on the testing device side according to an embodiment (sectional views taken along line A-A' in FIG. 3A and along line B-B' in FIG. 3B).

FIG. 2 is an external view illustrating a second test panel on the testing device side in a state of being coupled to the first test panel on the electronic device side attached to the chassis according to the present embodiment. FIG. 3A is a schematic view of the first connector surface of the first test panel on the electronic device side according to the present embodiment. FIG. 3B is a schematic view of an index surface of the second test panel on the testing device side according to the present embodiment. FIG. 4 shows sectional views of main parts of the first test panel on the electronic device side and the second test panel on the testing device side according to the present embodiment (sectional views taken along line A-A' in FIG. 3A and along line B-B' in FIG. 3B).

As shown in FIG. 2, a second test panel (a second test substrate or an interposer) TP2 on the testing device side is installed to oppose the surface facing outward from the chassis CH of the first test panel TP1, i.e. to oppose the first connector surface of the first test panel TP1 over which the first test-object connectors NC1 are mounted. The second test panel TP2 is provided with panel fixing mechanisms FM. The panel fixing mechanisms FM are coupled to outer portions of the first test panel TP1, thereby fixing the second test panel TP2 to the first test panel TP1.

As shown in FIG. 3A, the first connector surface of the first test panel TP1 is mounted with the first test-object connectors NC1.

Also, as shown in FIG. 3B and FIG. 4, the second test panel TP2 has a surface to face the first test panel TP1 (hereinafter referred to as the "second connector surface") and a surface facing away from the first test panel TP1 (hereinafter referred to as the "index surface). Namely, the second test panel TP2 has the second connector surface and the index surface. The second connector surface faces the first connector surface of the first test panel TP1. The index surface is the surface opposite to the second connector surface and does not face the first connector surface.

On the second connector surface of the second test panel TP2 facing the first connector surface of the first test panel TP1, second test-object connectors NC2 are mounted such that the second test-object connectors NC2 are positioned, shaped and oriented corresponding to the positions, shapes and indexes (coupling orientations) of the first test-object connectors NC1 mounted on the first connector surface of the first test panel TP1. The second test-object connectors NC2 are each provided with plural spring probes SP (also called spring pins, movable probe pins, contact probes, or Pogo pins (a product name of Augat Pylon Co., Inc.)).

The index surface of the second test panel TP2 not facing the first connector surface of the first test panel TP1 is attached with indexes IN. The indexes IN are attached with identification seals, for example, AA, BB, CC, DD, EE, FF, GG, HH and II as shown in FIG. 3B arranged to correspond to the positions of the first test-object connectors NC1 mounted over the first connector surface of the first test panel TP1. With the index surface facing outward from the chassis CH, the orientations of couplings between the first test-object connectors NC1 and the second test-object connectors NC2 can be easily recognized.

There is space provided between the second connector surface and the index surface of the second test panel TP2. The external terminals (not shown) of the second test-object connectors NC2 are exposed on the back side (facing the space) of the second connector surface of the second test panel TP2. The external terminals of the second test-object connectors NC2 are coupled with one ends of cables TCW for a testing device. The cables TCW are led out of the second test panel TP2 through a lower portion of the space provided between the second connector surface and the index surface of the second test panel TP2 (through the bottom portion of the second test panel TP2). The other ends of the cables TCW for a testing device are coupled to a testing device (not shown).

FIG. 5A is a schematic diagram showing first test-object connectors mounted on the first connector surface of the first test panel on the electronic device side and second test-object connectors mounted on the second connector surface of the second test panel on the testing device side in a state of facing each other according to the present embodiment. FIG. 5B is a schematic diagram showing the first and second test-object connectors shown in FIG. 5A in a state of being coupled to each other according to the present embodiment.

The connectors shown in FIGS. 5A and 5B represent four examples of the first test-object connectors mounted on the first connector surface of the first test panel on the electronic device side and four examples of the second test-object connectors mounted on the second connector surface of the second test panel on the testing device side.

As shown in FIG. 5A, the first test panel TP1 is provided with the first test-object connectors NC1$a$, NC1$b$, NC1C and NC1$d$ mounted on the first connector surface. The first test panel TP1 is attached to a chassis incorporated in semiconductor manufacturing equipment, for example, dicing equipment.

Also, the second test panel TP2 is provided with the second test-object connectors NC2$a$, NC2$b$, NC2$c$ and NC2$d$ mounted on the second connector surface of the second test panel TP2. The second test-object connectors NC2$a$, NC2$b$, NC2$c$ and NC2$d$ mounted on the second connector surface of the second test panel TP2 are positioned to correspond to the positions of the first test-object connectors NC1$a$, NC1$b$, NC1$c$ and NC1$d$ mounted on the first connector surface of the first test panel TP1. The second test-object connectors NC2$a$, NC2$b$, NC2$c$ and NC2$d$ are coupled with one ends of the cables TCW for a testing device.

The heights from the second connector surface of the second test-object connectors NC2$a$, NC2$b$, NC2$c$ and NC2$d$ mounted on the second connector surface of the second test panel TP2 are the same or substantially the same. Also, the distances between the second connector surface and the ends of the spring probes SP included in the second test-object connectors NC2$a$, NC2$b$, NC2$c$ and NC2$d$ are the same or substantially the same. On the other hand, the first test-object connectors NC1$a$, NC1$b$, NC1$c$ and NC1$d$ have respectively different heights from the first connector surface. Therefore, a mechanism to make up for the height differences between the first test-object connectors NC1$a$, NC1$b$, NC1$c$ and NC1$d$ is required where the first test-object connectors NC1$a$, NC1$b$, NC1$c$ and NC1$d$ and the second test-object connectors NC2$a$, NC2$b$, NC2$c$ and NC2$d$ are electrically coupled.

It is for this reason that the second test-object connectors NC2$a$, NC2$b$, NC2$c$ and NC2$d$ of the present embodiment are provided with extensible/retractable spring probes SP. The extensible/retractable spring probes SP make up for the height differences between the first test-object connectors NC1$a$, NC1$b$, NC1$c$ and NC1$d$.

To secure coupling between the first test panel TP1 and the second test panel TP2, the second test panel TP2 is further provided with panel fixing mechanisms FM each including a locking part LP, an elastic spring SSP and a panel fixing jig FP.

As shown in FIG. 5B, the second test-object connectors NC2$a$, NC2$b$, NC2$c$ and NC2$d$ mounted on the second connector surface of the second test panel TP2 are coupled to the first test-object connectors NC1$a$, NC1$b$, NC1$c$ and NC1$d$ mounted on the first connector surface of the first test panel TP1, respectively, and a functional test concerning an electrical characteristic of an electronic device is performed in the testing device. The second test-object connectors NC2$a$, NC2$b$, NC2$c$ and NC2$d$ are coupled with one ends of the cables for a testing device TCWa, TCWb, TCWc and TCWd, respectively. With the panel fixing mechanisms FM fixing the first test panel TP1 and the second test panel TP2, the first test panel TP1 and the second test panel TP2 are securely prevented from electrically severed from each other during testing.

Next, the couplings between the first test-object connectors NC1$a$, NC1$b$, NC1$c$ and NC1$d$ mounted on the first connector surface of the first test panel TP1 and the second test-object connectors NC2$a$, NC2$b$, NC2$c$ and NC2$c$ mounted on the second connector surface of the second test panel TP2 will be described in detail with reference to FIGS. 6 to 8.

Figure 6:
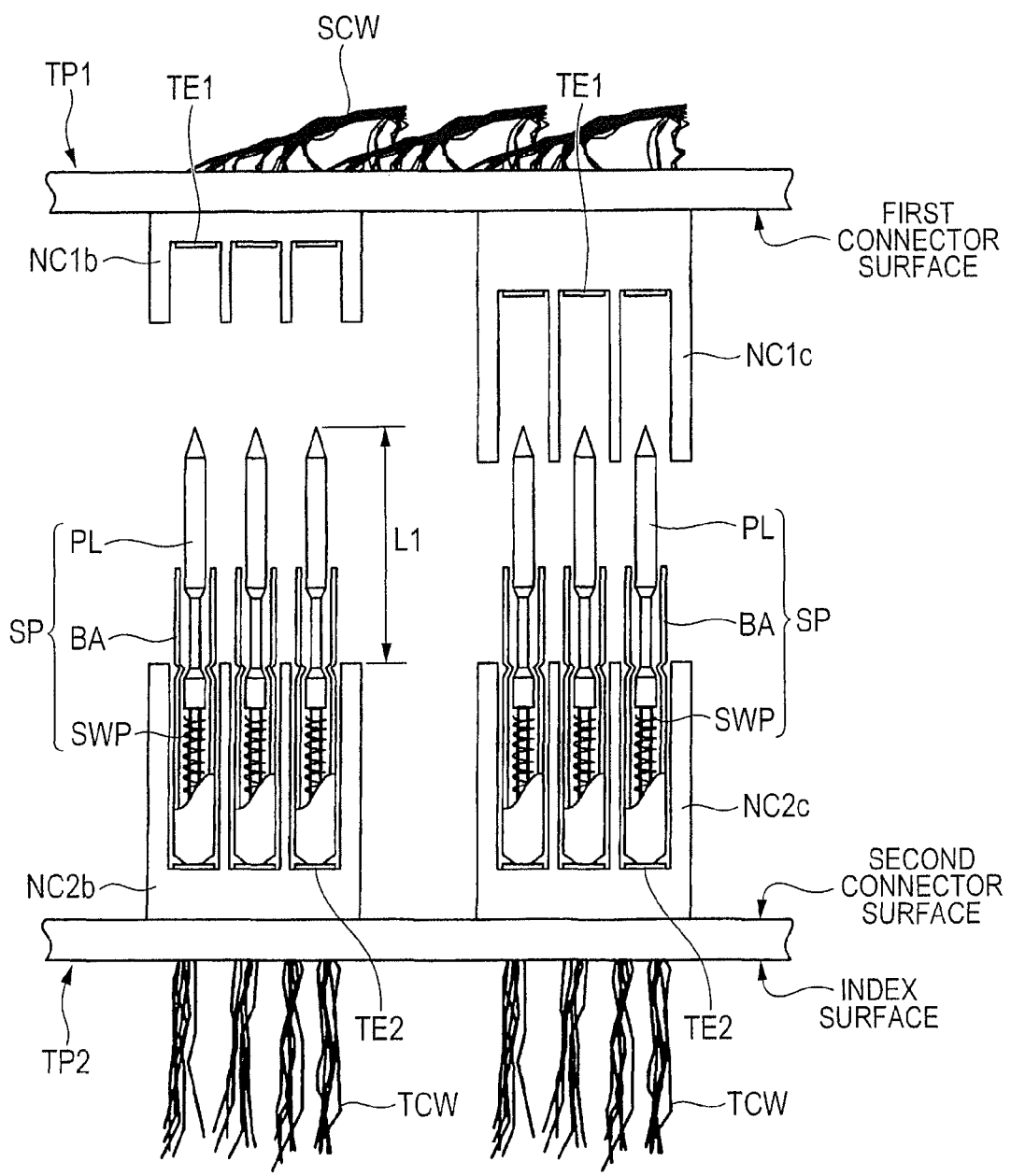
FIG. 6 is a main-part sectional view showing two of the first test-object connectors mounted on the first connector surface of the first test panel on the electronic device side and the corresponding two of the second test-object connectors mounted on the second connector surface of the second test panel on the testing device side in a state before being coupled via probes included in the two second test-object connectors.

FIG. 6 is a main-part sectional view showing two of the first test-object connectors mounted on the first connector surface of the first test panel on the electronic device side and the corresponding two of the second test-object connectors mounted on the second connector surface of the second test panel on the testing device side in a state before being coupled via the probes included in the two second test-object connectors. FIG. 7 is a main-part sectional view showing the two first test-object connectors and the two second test-object connectors shown in FIG. 6 in a state with one of the two first test-object connectors and the corresponding one of the two second test-object connectors coupled together via the probes included in the one of the two second test-object connectors. FIG. 8 is a main-part sectional view showing the two first test-object connectors and the two second test-object connectors shown in FIG. 7 in a state subsequent to the state shown in FIG. 7 with the two first test-object connectors and the two second test-object connectors coupled together via the probes included in the two second test-object connectors.

Figure 7:
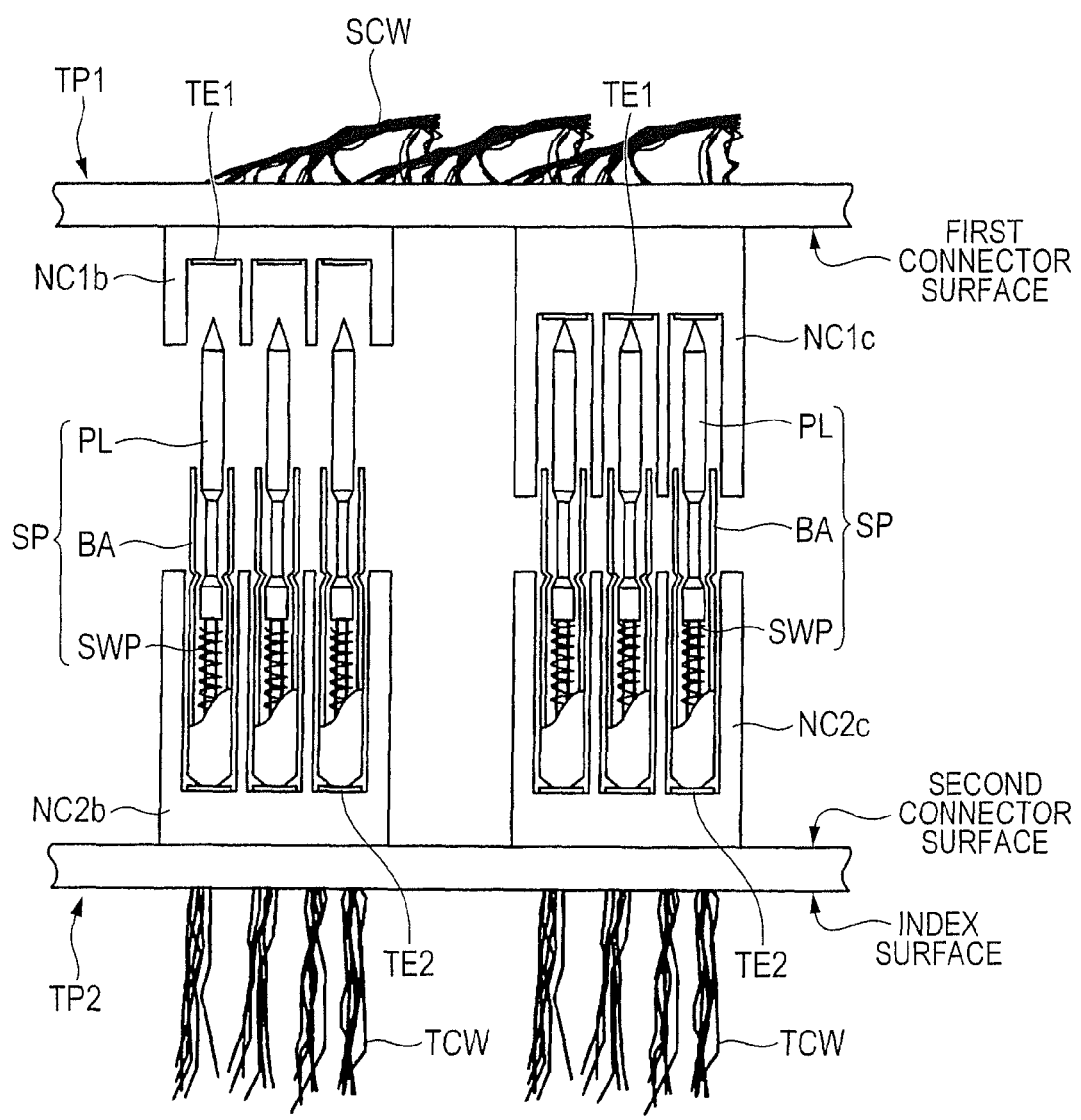
FIG. 7 is a main-part sectional view showing the two first test-object connectors and the two second test-object connectors shown in FIG. 6 in a state with one of the two first test-object connectors and the corresponding one of the two second test-object connectors coupled together via the probes included in the one of the two second test-object connectors.
Figure 8:
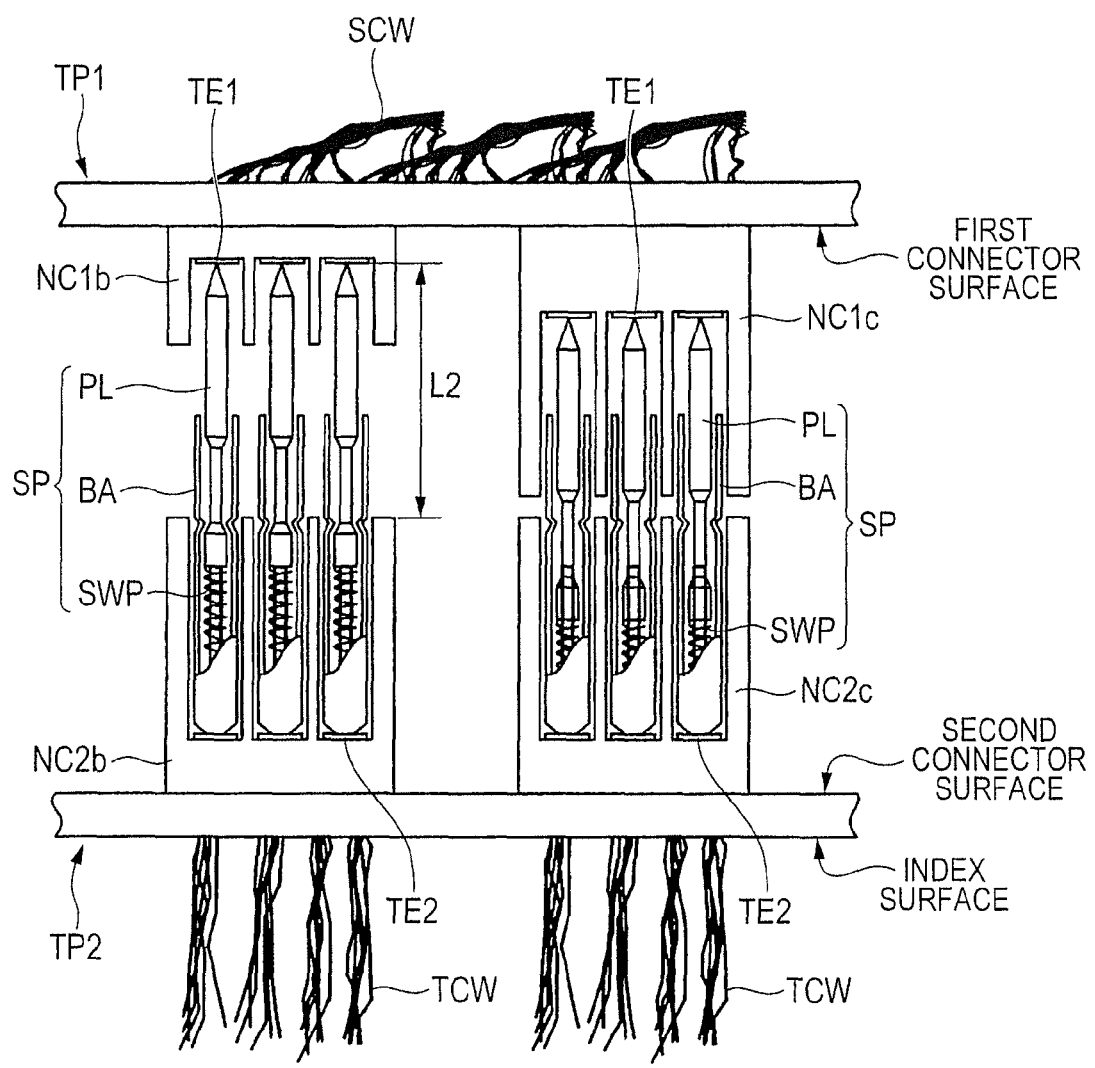
FIG. 8 is a main-part sectional view showing the two first test-object connectors and the two second test-object connectors shown in FIG. 7 in a state subsequent to the state shown in FIG. 7 with the two first test-object connectors and the two second test-object connectors coupled together via the probes included in the two second test-object connectors.

In the following, referring to FIGS. 6 to 8 illustrating the first test-object connectors NC1$b$ and NC1$c$ mounted on the first connector surface of the first test panel TP1 and the second test-object connectors NC2$b$ and NC2$c$ mounted on the second connector surface of the second test panel TP2 as example connectors, the couplings between the first and the second test-object connectors will be described in detail.

As shown in FIG. 6, the second test-object connectors NC2$b$ and NC2$c$ each have plural concave portions each mounted with a spring probe SP. Each spring probe SP mainly includes a plunger (a tip portion) PL, a barrel (an approximately cylindrical body part) BA and a spring SWP housed inside the barrel BA. The spring probes SP are mounted in the concave portions, respectively, such that they project from the second test-object connectors NC2$b$ and NC2$c$. The lengths of the spring probes SP projecting from the second test-object connectors NC2$b$ and NC2$c$ are the same or substantially the same.

Each of the concave portions has a second terminal TE2 formed at the bottom thereof. The end portion opposite to the plunger PL of the spring probe SP mounted in the concave portion is coupled to the second terminal TE2. The second terminal TE2 is electrically coupled with one end of the corresponding cable TCW for a testing device.

The first test-object connectors NC1$b$ and NC1$c$ each have plural concave portions into which the corresponding spring probes SP are inserted. Each of the plural concave portions has a first terminal TE1 formed at the bottom thereof. The first terminal TE1 is contacted by the tip of the plunger PL of the corresponding spring probe SP. The first terminal TE1 is electrically coupled with one end of the corresponding cable for a test-object SCW.

The first terminals TE1 included in the first test-object connector NC1$b$ and the first terminals TE1 included in the first test-object connector NC1$c$ differ in the distance from the first connector surface of the first test panel. Namely, the distance between the first terminals TE1 included in the first test-object connector NC1$b$ and the first connector surface of the first test panel is shorter than the distance between the first terminals TE1 included in the first test-object connector NC1$c$ and the first connector surface of the first test panel (the first terminals TE1 included in the first test-object connector NC1$b$ are closer to the first connector surface). In other words, the distance between the first terminals TE1 included in the first test-object connector NC1$b$ and the tips of the corresponding spring probes SP is longer than the distance between the first terminals TE1 included in the first test-object connector NC1$c$ and the tips of the corresponding spring probes SP (the first terminals TE1 included in the first test-object connector NC1$b$ are farther from the tips of the corresponding probes SP).

Therefore, as shown in FIG. 7, when the second test panel TP2 is brought closer to the first test panel TP1, first, the first terminals TE1 included in the first test-object connector NC1$c$ are contacted to the tips of the corresponding spring probes SP. As a result, cables SCW for an object to be tested which are coupled to an electronic device and cables TCW for a testing device which are coupled to a testing device are electrically coupled via the first terminals TE1 included in the first test-object connector NC1$c$ and the spring probes SP and second terminals TE2 included in the second test-object connector NC2$c$.

When the second test panel TP2 is brought further closer to the first test panel TP1, the first terminals TE1 included in the first test-object connector NC1$b$ are contacted by the tips of the corresponding spring probes SP as shown in FIG. 8. As a result, cables SCW for an object to be tested which are coupled to an electronic device and cables TCW for a testing device which are coupled to a testing device are electrically coupled via the first terminals TE1 included in the first test-object connector NC1$b$ and the spring probes SP and second terminals TE2 included in the second test-object connector NC2$b$.

To secure electrical couplings between the first terminals TE1 included in the first test-object connectors NC1$b$ and NC1$c$ and the second terminals TE2 included in the corresponding second test-object connectors NC2$b$ and NC2$c$, it is necessary to adjust the lengths of the spring probes SP projecting from the second test-object connectors NC2$b$ and NC2$c$.

Referring to FIG. 6, L1 represents the distance between the tips of the spring probes SP and the second test-object connectors NC2$b$ in a state in which the tips of the spring probes SP are not yet in contact with the first terminals TE1 included in the first test-object connectors NC1$b$ and NC1$c$. Referring to FIG. 8, the first terminals TE1 included in the first test-object connector NC1$b$ are contacted by the tips of the corresponding spring probes SP only after the first terminals TE1 included in the first test-object connector NC1$c$ are contacted by the tips of the corresponding spring probes SP, causing the spring probes SP having come in contact with the first terminals TE1 included in the first test-object connector NC1$c$ to be immovable. The distance, when such a state occurs, between the tips of the spring probes SP included in the second test-object connector NC2$b$ and the second test-object connector NC2$b$ is represented by L2. When L1 and L2 are in the relationship expressed by the following equation (1), the electrical couplings between the first terminals TE1 included in the first test-object connector NC1$b$ and the second terminals TE2 included in the corresponding second test-object connector NC2$b$ and between the first terminals TE1 included in the first test-object connector NC1$c$ and the second terminals TE2 included in the corresponding second test-object connector NC2$c$ can be secured.

$$L1 \geq L2 \tag{1}$$

As shown in FIG. 2 and FIG. 3B, the index surface of the second test panel TP2 is attached with indexes IN showing coupling orientations between the first test-object connectors NC1 and the second test-object connectors NC2. This securely prevents wrong couplings between the first test-object connectors NC1 and the second test-object connectors NC2.

Thus, according to the present embodiment, to test an electronic device EA mounted in semiconductor manufacturing equipment, a first test panel TP1 mounted, on a first connector surface thereof, with plural first test-object connectors NC1 and a second test panel TP2 mounted, on a second connector surface thereof, with plural second test-object connectors NC2 respectively including extensible/retractable probes are provided. The second test-object connectors NC2 mounted on the second connector surface of the second test panel TP2 are arranged such that, when the first connector surface of the first test panel TP1 and the second connector surface of the second test panel TP2 are positioned to face each other, the second test-object connectors NC2 are positioned to face the corresponding first test-object connectors NC1.

This makes it possible to position the first connector surface of the first test panel TP1 and the second connector surface of the second test panel TP2 to face each other and couple the first test-object connectors NC1 mounted on the first connector surface of the first test panel TP1 and the second test-object connectors NC2 mounted on the second connector surface of the second test panel TP2 at a time. Also, by applying indexes IN indicating the positions of the second test-object connectors NC2 to the index surface opposite to the second connector surface of the second test panel TP2, the first test panel TP1 and the second test panel TP2 can be correctly coupled.

Furthermore, the first terminals TE1 included in the first test-object connectors NC1 mounted on the first connector surface of the first test panel TP1 and the second terminals TE2 included in the second test-object connectors NC2 mounted on the second connector surface of the second test panel TP2 are coupled via extensible/retractable spring probes SP, and the first test panel TP1 and the second test panel TP2 are fixed together using panel fixing mechanisms.

In this way, the first test-object connectors NC1 mounted on the first connector surface of the first test panel TP1 and the second test-object connectors NC2 mounted on the second connector surface of the second test panel TP2 can be accurately and quickly coupled together, so that the time required to test an electronic device EA can be reduced.

Modification Example 1

Figure 9:
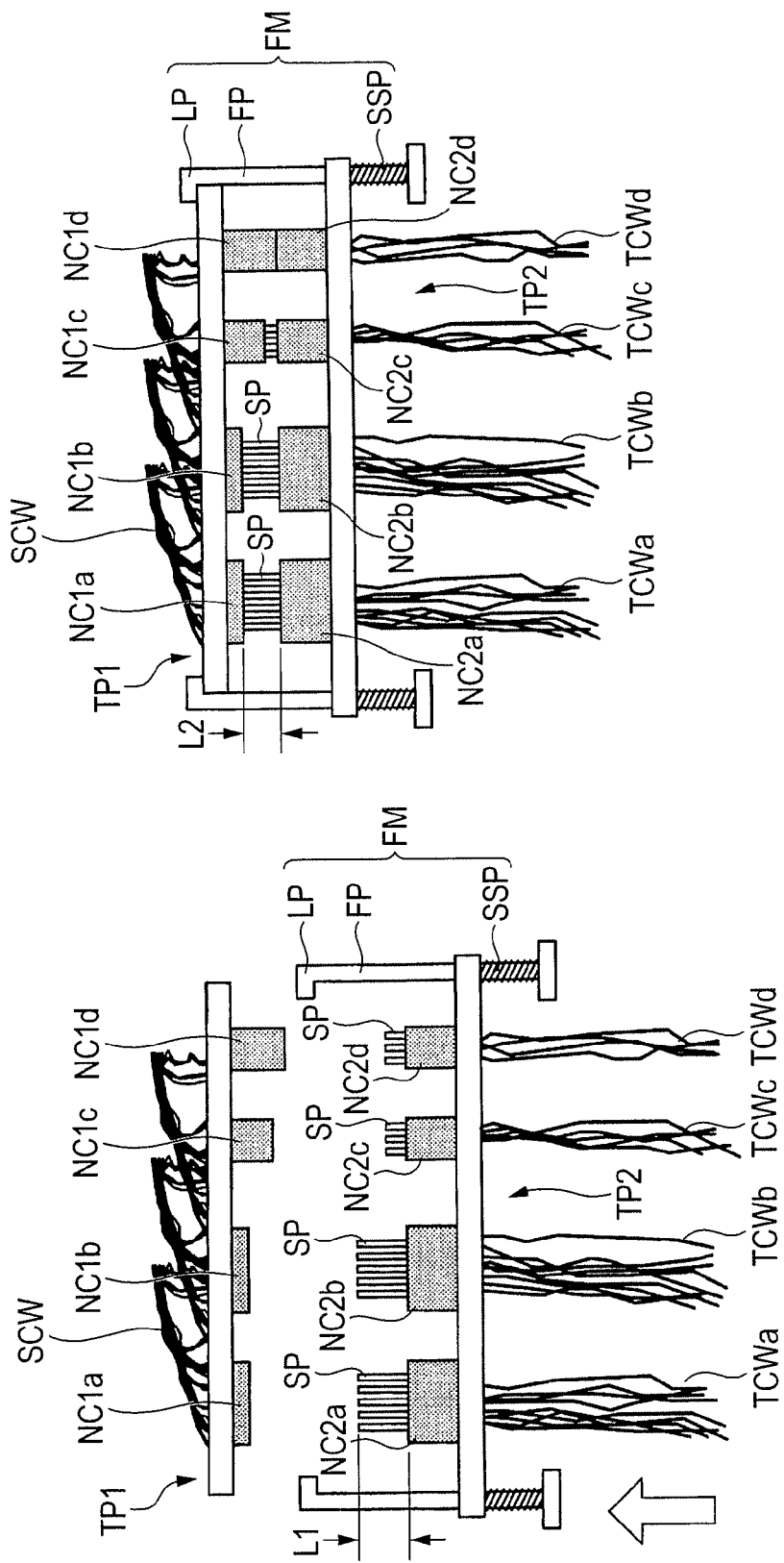
FIG. 9A is a schematic diagram showing plural first test-object connectors mounted on a first connector surface of a first test panel on the electronic device side and plural second test-object connectors mounted on a second connector surface of a second test panel on the testing-device side according to an embodiment modification example 1 in a mutually facing state.
FIG. 9B is a schematic diagram showing the first and the second test-object connectors shown in FIG. 9A in a mutually coupled state.

Modification example 1 of the present embodiment will be described below with reference to FIGS. 9A and 9B. FIG. 9A is a schematic diagram showing plural first test-object connectors mounted on a first connector surface of a first test panel on the electronic device side and plural second test-object connectors mounted on a second connector surface of a second test panel on the testing-device side in a mutually facing state according to the modification example 1. FIG. 9B is a schematic diagram showing the first and the second test-object connectors shown in FIG. 9A in a mutually coupled state.

An aspect different between the foregoing embodiment and the present modification example 1 will be described below.

According to the foregoing embodiment, the lengths of the extensible/retractable spring probes SP included, as shown in FIGS. 5A and 5B, in the second test-object connectors NC2a, NC2b, NC2c and NC2d are the same or substantially the same.

According to the modification example 1, of the spring probes SP included in the second test-object connectors NC2a, NC2b, NC2c and NC2d, those projected from the second test-object connector NC2a and NC2b and those projected from the second test-object connector NC2c and NC2d differ in length.

In the case of the modification example 1, too, when L1 and L2 are in the foregoing relationship of L1≥L2, the first terminals TE1 included in the first test-object connectors NC1a, NC1b, NC1c and NC1d and the second terminals TE2 included in the second test-object connectors NC2a, NC2b, NC2c and NC2d can be securely electrically coupled.

Modification Example 2

Figure 10:
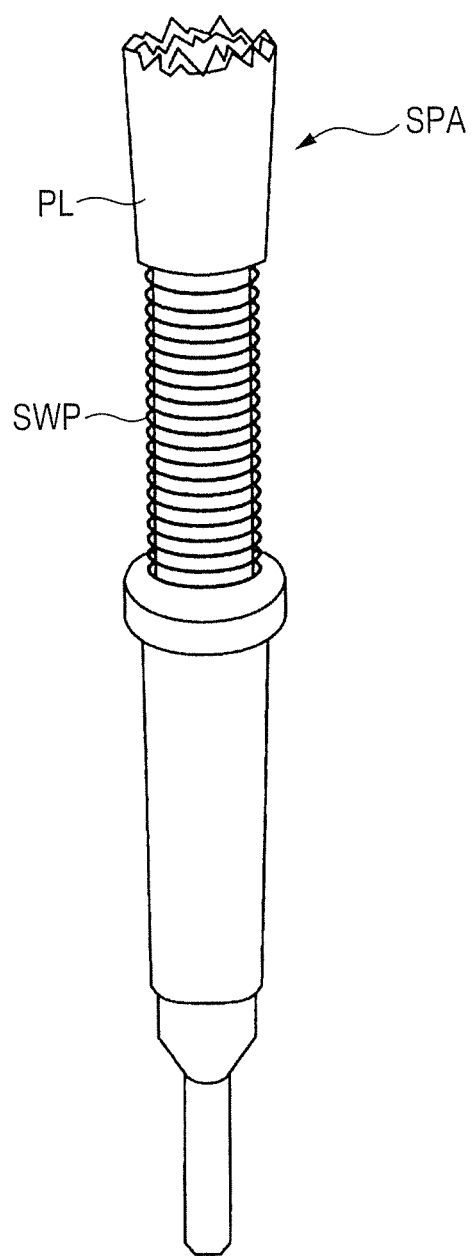
FIG. 10 is a schematic diagram illustrating a shape of a spring probe according to an embodiment modification example 2.

A spring probe shape according to a modification example 2 will be described below with reference to FIG. 10. FIG. 10 is a schematic diagram illustrating a shape of a spring probe according to the modification example 2.

According to the foregoing embodiment, each spring probe SP includes the plunger PL, barrel BA and spring SWP, and the plunger PL has a conical tip.

The shape of the tip of each spring probe SP need not necessarily be conical. For example, as shown in FIG. 10, a spring probe SPA may have a rugged end face including plural projections. When such a spring probe SPA and a first terminal included in a first test-object connector mounted on the first connector surface of the first test panel are coupled, plural contact points are generated, so that the contact steadiness between the spring probe SPA and the first terminal increases.

The invention made by the present invertors has been described in concrete terms based on an embodiment, but the invention is not limited to the foregoing embodiment. The invention can be modified in various ways without departing from the scope thereof as defined in the appended claims.

In the foregoing embodiment, the present invention is applied to testing of an electronic device mounted in dicing equipment which is semiconductor manufacturing equipment, but the invention can also be applied to other semiconductor manufacturing equipment. Also, the application of the present invention is not limited to semiconductor manufacturing equipment. The present invention can also be applied to testing of other manufacturing equipment.

What is claimed is:

1. A testing method for semiconductor manufacturing equipment comprising the steps of:
   (a) providing a first test panel which includes a first connector surface and a plurality of first test-object connectors mounted over the first connector surface, each of the plurality of first test object connectors having a terminal electrically coupled with an object to be tested,
   (b) providing a second test panel which includes a second connector surface and a plurality of second test-object connectors mounted over the second connector surface, each of the plurality of second test object connectors having a probe that is extensible and retractable in a direction from the second connector surface of the second test panel toward the first connector surface of the first test panel, and
   (c) testing an electrical characteristic of the object to be tested by, in a state with the first connector surface of the first test panel and the second connector surface of the second test panel facing each other, coupling the probes of the second test-object connectors to respective terminals of the first test-object connectors, wherein the distances between the first connector surface of the first test panel and the terminals respectively included in the first test-object connectors are not uniform.

2. The testing method for semiconductor manufacturing equipment according to claim 1, wherein the distances between the second connector surface of the second test panel and respective tips of the probes are uniform in the second test-object connectors.

3. The testing method for semiconductor manufacturing equipment according to claim 1,
wherein the terminals respectively included in the first test-object connectors each include:
a first group of terminals having a first distance from the first connector surface of the first test panel; and
a second group of terminals having a second distance shorter than the first distance from the first connector surface of the first test panel,
wherein the probes respectively included in the second test-object connectors each include:
a first group of probes facing the first group of terminals; and
a second group of probes facing the second group of terminals, and
wherein, after respective tips of the first group of probes contact the first group of terminals, respective tips of the second group of probes contact the second group of terminals.

4. The testing method for semiconductor manufacturing equipment according to claim 3, wherein a relationship of L1≥L2 is kept, L1 representing the distance, in a state with neither the tips of the first group of probes contacting the first group of terminals nor the tips of the second group of probes contacting the second group of terminals, between the tips of the probes respectively projecting from the second test-object connectors and the second test-object connectors, L2 representing the distance, when the tips of the second group of probes contact the second group of terminals after the first group of terminals are contacted by the tips of the first group of probes causing the first group of probes to be immovable, between the tips of the probes respectively projecting from the second test-object connectors and the second test-object connectors.

5. The testing method for semiconductor manufacturing equipment according to claim 1, further comprising the step of:
fixing the second test panel to the first test panel by coupling a fixing mechanism of the second test panel to an outer portion of the first test panel.

6. The testing method for semiconductor manufacturing equipment according to claim 1, wherein the second test panel has markings provided on a surface thereof which, not facing the first connector surface of the first test panel, is opposite to the second connector surface of the second test panel, the markings identifying the terminals included in the first test-object connectors.

7. The testing method for semiconductor manufacturing equipment according to claim 1, wherein the tips of the probes are conical.

8. The testing method for semiconductor manufacturing equipment according to claim 1, wherein the probes each have an end face including a plurality of projections to cause the end face of each of the probes to be coupled to a corresponding one of the terminals via a plurality of contact points.

* * * * *